(12) United States Patent
Ishikawa

(10) Patent No.: US 7,567,476 B2
(45) Date of Patent: Jul. 28, 2009

(54) SEMICONDUCTOR MEMORY DEVICE AND TESTING METHOD THEREOF

(75) Inventor: Toru Ishikawa, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 192 days.

(21) Appl. No.: 11/392,583

(22) Filed: Mar. 30, 2006

(65) Prior Publication Data
US 2006/0233035 A1    Oct. 19, 2006

(30) Foreign Application Priority Data
Mar. 30, 2005  (JP) .............................. 2005-098056

(51) Int. Cl.
*G11C 7/00* (2006.01)
(52) U.S. Cl. .................. 365/219; 365/220; 365/221
(58) Field of Classification Search ................ 365/233, 365/219, 220, 233.11
See application file for complete search history.

(56) References Cited

U.S. PATENT DOCUMENTS

| | | | |
|---|---|---|---|
| 6,191,991 B1 * | 2/2001 | Wada .......................... | 365/219 |
| 6,343,041 B1 * | 1/2002 | Kanazashi ................... | 365/219 |
| 6,421,291 B1 * | 7/2002 | Watanabe et al. ........... | 365/219 |
| 6,570,800 B2 * | 5/2003 | Tanaka et al. ............... | 365/219 |
| 6,762,969 B2 | 7/2004 | Sasaki et al. | |
| 7,363,555 B2 | 4/2008 | Lee | |
| 2003/0126524 A1 | 7/2003 | Kashihara et al. | |
| 2004/0085832 A1 * | 5/2004 | Kanda et al. ................ | 365/200 |

FOREIGN PATENT DOCUMENTS

| | | |
|---|---|---|
| JP | 2001-067892 | 3/2001 |
| JP | 2003-233999 | 8/2003 |
| JP | 2003-257199 | 9/2003 |
| JP | 2003-272382 A | 9/2003 |
| JP | 2004-133961 A | 4/2004 |
| JP | 2004-164769 A | 6/2004 |
| JP | 2004-310918 A | 11/2004 |
| JP | 2004-310989 A | 11/2004 |
| JP | 2006-114192 | 4/2006 |

OTHER PUBLICATIONS

Japanese Office Action, with English translation thereof, issued in Patent Application No. JP 2005-098056 dated on Jul. 29, 2008.

* cited by examiner

*Primary Examiner*—Van Thu Nguyen
*Assistant Examiner*—Han Yang
(74) *Attorney, Agent, or Firm*—McDermott Will & Emery LLP

(57) ABSTRACT

A semiconductor memory device includes mini arrays and a serial-parallel conversion circuit. The serial-parallel conversion circuit simultaneously writes two continuous data into mutually different mini arrays out of plural data that are continuously input synchronously with an internal clock, and continuously outputs two data simultaneously read from different mini arrays, synchronously with the internal clock. In testing the semiconductor memory device according to the present invention, one data is written during a period when an external clock having a cycle of an integer times cycle of the internal clock is fixed to a high level or a low level. With this arrangement, continuous data can be assigned to mutually different mini arrays.

9 Claims, 11 Drawing Sheets

SEMICONDUCTOR MEMORY DEVICE AND TESTING METHOD THEREOF

TECHNICAL FIELD

The present invention relates to a semiconductor memory device and a testing method thereof. Particularly, the present invention relates to a synchronous semiconductor memory device that inputs and outputs data synchronously with a high-speed clock, and a testing method thereof.

BACKGROUND OF THE INVENTION

Conventionally, a synchronous DRAM (Dynamic Random Access Memory), that inputs and outputs data and a signal such as an address synchronously with a clock, is used in a wide range. While the speed of a clock used in a synchronous DRAM increases every year, the speed of a DRAM core cannot be increased in proportion to an input and output signal rate, because the DRAM core requires a precharge operation and a sense operation. Therefore, a synchronous DRAM has a "prefetch circuit" between a DRAM core and an input and output pin, and the prefetch circuit carries out a serial-parallel conversion, thereby achieving an apparent high-speed operation. See Patent Laid-Open Nos. 2004-164769, 2004-310989, 2004-133961, 2003-272382, and 2004-310918.

For example, when a DRAM core operates at 133 MHz, a prefetch circuit executes a prefetch of four bits, thereby obtaining a data transfer rate of 533 MHz to transfer the data to the outside. Furthermore, when the DRAM core operates at 200 MHz, the prefetch circuit executes a prefetch of 16 bits, thereby obtaining a data transfer rate of 3.2 GHz.

However, when the data transfer rate increases using the prefetch circuit, it also becomes necessary to use a high-speed tester to test the operation of the DRAM. In other words, in order to test the DRAM that operates at 3.2 GHz, it is necessary to use a tester that can input and output data at 3.2 GHz. Therefore, a conventional tester that does not have this capacity cannot be used as it is. Furthermore, because the operation test of a DRAM is carried out in a wafer state before dicing, a probe of a tester also becomes relatively large. Therefore, a parasitic capacitance of the tester becomes larger than that of wiring actually used, and the speed of the tester cannot be increased easily.

These problems occur not only in the DRAM but also synchronous semiconductor memory devices in general.

SUMMARY OF THE INVENTION

The present invention has been achieved to solve the problems mentioned above, and it is an object of the present invention to provide an improved semiconductor memory device that inputs and outputs data synchronously with a high-speed clock.

It is another object of the present invention to provide a synchronous semiconductor memory device that can carry out a test using a low-speed tester.

It is still another object of the present invention to provide a testing method of the semiconductor memory devices mentioned above.

The above and other objects of the present invention can be accomplished by a semiconductor memory device, comprising: a plurality of mini arrays; and a serial-parallel conversion circuit that supplies write data to the plurality of mini arrays and outputs read data supplied from the mini arrays, wherein said serial-parallel conversion circuit simultaneously supplies at least two continuous write data to different mini arrays that are continuously supplied from an outside synchronously with an internal clock, and continuously outputs at least two read data simultaneously supplied from different mini arrays, synchronously with the internal clock.

In carrying out a test of a semiconductor memory device according to the invention, instead of using a plurality of data continuously input synchronously with an internal clock as desired logical values, the same data is written during a period while an external clock having an integer times cycle of an internal clock is fixed to a high level or a low level. With this arrangement, continuous data can be assigned to mutually different mini arrays. Accordingly, even when a switching cycle of input data decreases, individual data written into the same mini arrays can be optional values. Consequently, a lower-speed tester can be used to carry out an operation test.

A testing method of a semiconductor memory device according to the invention is used to test the semiconductor memory device mentioned above. According to this method, test data is continuously supplied to a serial-parallel conversion circuit synchronously with an external clock. Therefore, when test data having different logical values for each half cycle of an external clock are alternately supplied, test data having different logical values can be written into adjacent memory cells in the same mini array. With this arrangement, a pattern sensitivity test can be carried out correctly.

According to the present invention, a low-speed tester can be used to correctly test the operation of a semiconductor memory device that inputs and outputs data synchronously with a high-speed clock. Therefore, it is not necessary to develop a high-speed tester to match the operation speed of a semiconductor memory device. Consequently, the manufacturing cost of a semiconductor memory device can be reduced.

BRIEF DESCRIPTION OF THE DRAWINGS

The above and other objects, features and advantages of this invention will become more apparent by reference to the following detailed description of the invention taken in conjunction with the accompanying drawings, wherein.

DETAILED DESCRIPTION OF THE
EMBODIMENTS

Preferred embodiments of the present invention will now be explained in detail with reference to the drawings.

Figure 1:
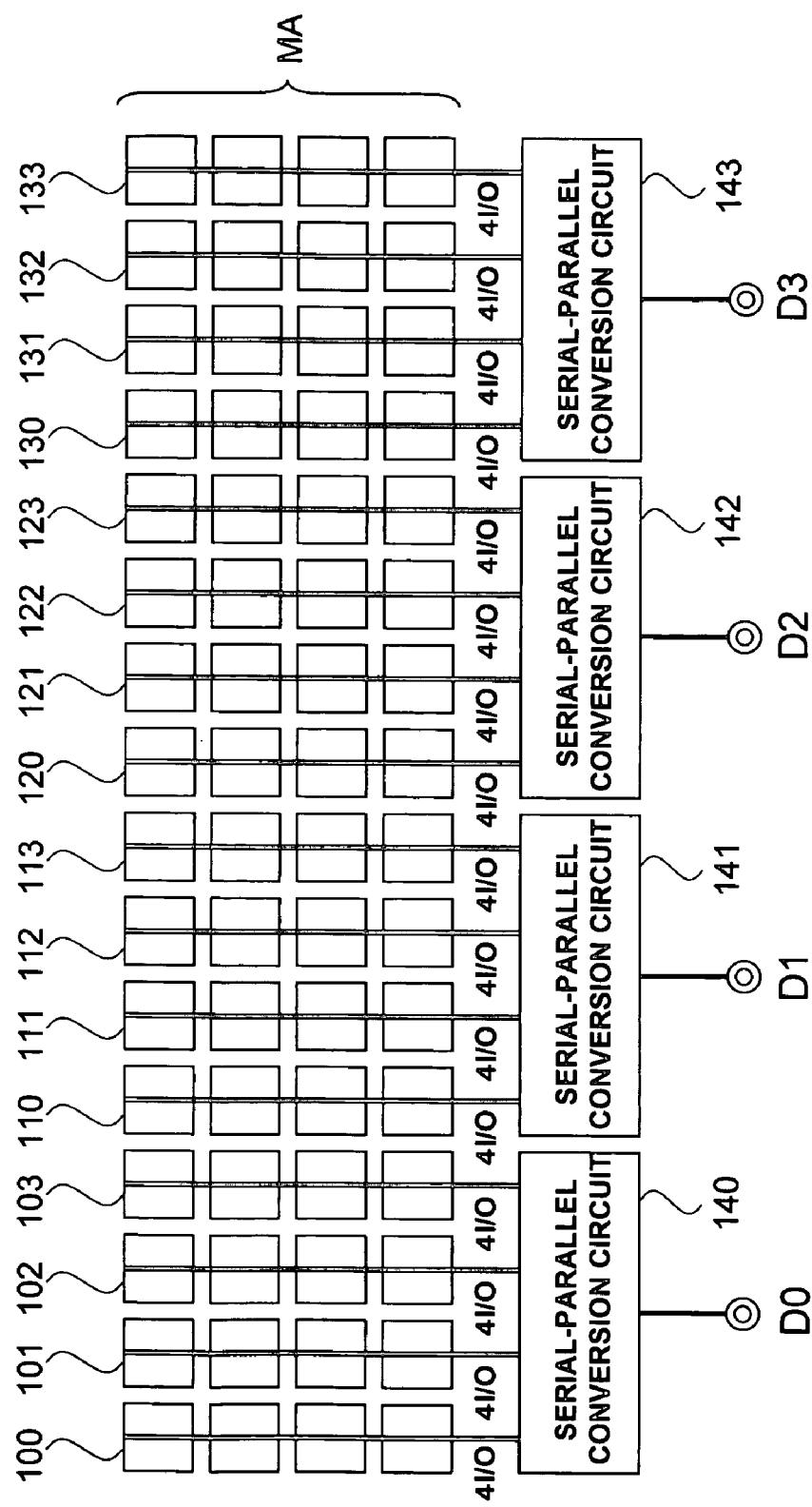
FIG. 1 is a schematic diagram of an entire configuration of a semiconductor memory device according to a preferred embodiment of the present invention.

FIG. 1 is a schematic diagram of an entire configuration of a semiconductor memory device according to a preferred embodiment of the present invention.

The semiconductor memory device according to the present invention is a DRAM. As shown in FIG. 1, the semiconductor memory device includes a core region MA constituted by a plurality of mini arrays, data input and output pins D0 to D3, and serial-parallel conversion circuits 140 to 143 that are disposed between these data input and output pins and mini arrays.

The semiconductor memory device also includes various other elements necessary for the operation of the DRAM, such as various decoder circuits, precharge circuits, address pins, and command pins. However, these elements are not directly relevant to the scope of the invention, and are therefore omitted from the drawing.

The semiconductor memory device according to this embodiment inputs and outputs four-bit data in parallel via the four data input and output pins D0 to D3, as an example. It is worth noting that the semiconductor memory device according to the present invention is not limited to this configuration, and can have one data input and output pin or eight data input and output pins. In this embodiment, the four serial-parallel conversion circuits 140 to 143 are provided corresponding to the four data input and output pins D0 to D3. In this embodiment, the serial-parallel conversion circuits 140 to 143 and the core region MA are mutually connected via 16 internal buses.

As shown in FIG. 1, four groups of mini arrays are connected to each of the serial-parallel conversion circuits 140 to 143. In other words, four groups of mini arrays 100 to 103 are connected to the serial-parallel conversion circuit 140. Similarly, four groups of mini arrays 110 to 113, 120 to 123, and 130 to 133, respectively are connected to the serial-parallel conversion circuits 141 to 143, respectively. One mini array group (for example, the group of the mini array 100) is connected to a corresponding one of the serial-parallel conversion circuits 140 to 143 via four internal buses.

As shown in FIG. 1, configurations corresponding to the data input and output pins D0 to D3 are the same. Therefore, a configuration corresponding to the data input and output pin D0 is explained next. Configurations corresponding to the data input and output pins D1 to D3 are also similar to those described below.

Figure 2:
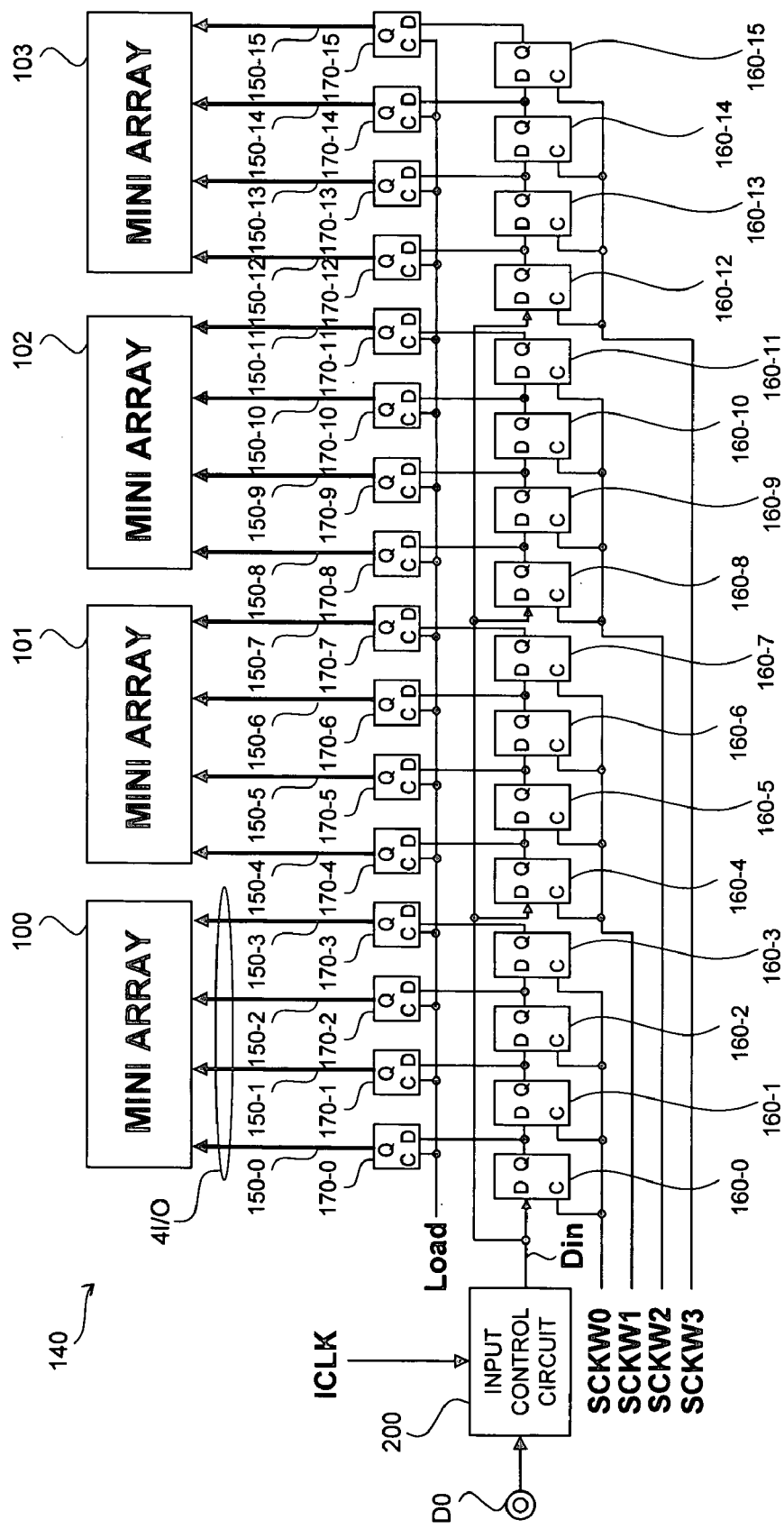
FIG. 2 is a circuit diagram showing elements relevant to the data writing, in the serial-parallel conversion circuit shown in FIG. 1.

FIG. 2 is a circuit diagram showing elements concerning data writing, in the serial-parallel conversion circuit 140.

As shown in FIG. 2, the serial-parallel conversion circuit 140 includes latch circuits 160-0 to 160-15 and latch circuits 170-0 to 170-15 that correspond to 16 internal buses 150-0 to 150-15, respectively. Among the 16 internal buses 150-0 to 150-15, four internal buses 150-0 to 150-3 are connected to the group of the mini array 100. Four internal buses 150-4 to 150-7 are connected to the group of the mini array 101. Four internal buses 150-8 to 150-11 are connected to the group of the mini array 102, and four internal buses 150-12 to 150-15 are connected to the group of the mini array 103.

The 16 latch circuits 160-0 to 160-15 are divided into four groups corresponding to the groups of the mini arrays 100 to 103, respectively. In other words, the 16 latch circuits 160-0 to 160-15 are divided into a group of the latch circuits 160-0 to 160-3, a group of the latch circuits 160-4 to 160-7, a group of the latch circuits 160-8 to 160-11, and a group of the latch circuits 160-12 to 160-15. Shift clocks SCKW0 to SCKW3 are connected in common to a clock node C of a latch circuit that constitutes each group.

Latch circuits that constitute each group are subordinately connected to each other. In other words, an output node Q of a pre-stage latch circuit is connected to an input node D of a post-stage latch circuit. With this arrangement, latch circuits that constitute each group form what is called a shift register. Input data Din that is supplied via an input control circuit 200 is supplied in common to the latch circuits 160-0, 160-4, 160-8, and 160-12.

When the levels of the shift clocks SCKW0 to SCKW3 supplied to the clock nodes C of the latch circuits 160-0 to 160-15 change, that is, when the levels of the shift clocks SCKW0 to SCKW3 change from a high level to a low level or from a low level to a high level, the latch circuits 160-0 to 160-15 fetch data supplied to the input nodes D, and output the data to the output nodes Q.

The output nodes Q of the latch circuits 160-0 to 160-15, respectively are also connected to the input nodes D of the corresponding latch circuits 170-0 to 170-15, respectively. A load signal Load is connected in common to clock nodes C of the latch circuits 170-0 to 170-15, respectively.

On the other hand, in addition to the input data supplied via the data input and output pin D0, an internal clock ICLK is also supplied to the input control circuit 200. The input control circuit 200 fetches data synchronously with the internal clock ICLK. The internal clock ICLK is internally generated by a PLL (Phase Locked Loop) circuit (not shown) and has a frequency which is an integer times that of an external clock. In this embodiment, the frequency of the internal clock ICLK is four times that of the external clock. Therefore, when the external clock is 400 MHz, for example, the internal clock ICLK is 1.6 GHz.

Figure 3:
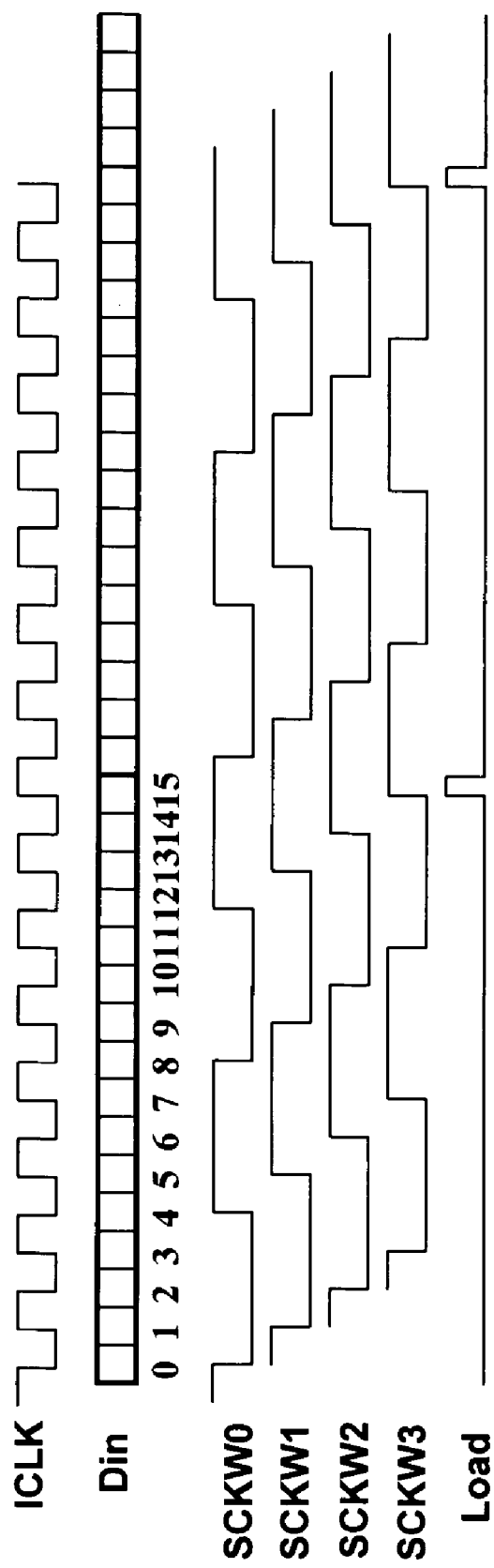
FIG. 3 is a timing diagram for explaining the operation of the circuits shown in FIG. 2.

FIG. 3 is a timing diagram for explaining the operation of the circuits shown in FIG. 2.

As shown in FIG. 3, input data Din are continuously input to the data input and output pin D0 synchronously with the internal clock ICLK. In synchronism with the internal clock ICLK, the shift clocks SCKW0 to SCKW3 having mutually different phases are supplied to four writing shift registers.

Each of the shift clocks SCKW0 to SCKW3 has a four times cycle that of the internal clock ICLK. Therefore, four input data Din are continuously supplied during a half cycle of the shift clocks SCKW0 to SCKW3, that is, during a period from a rising edge to a falling edge (or during a period from a fall edge to a rising edge), and data are shifted at the rising edge and the falling edge of the shift clocks SCKW0 to SCKW3. Furthermore, as shown in FIG. 3, the phases of the shift clocks SCKW0 to SCKW3 are shifted by 45 degrees. In other words, the phases are shifted by a half cycle of the internal clock ICLK.

Accordingly, when the input data Din continuously supplied synchronously with the internal clock ICLK are Din0 to Din15 in the order of the input, Din0 to Din3 are fetched by the last-stage latch circuits 160-3, 160-7, 160-11, and 160-15 that constitute shift registers, respectively. Similarly, Din4 to Din7 are fetched by the third-stage latch circuits 160-2, 160-6, 160-10, and 160-14, respectively. Din8 to Din11 are fetched by the second-stage latch circuits 160-1, 160-5, 160-

9, and 160-13, respectively. Din12 to Din15 are fetched by the first-stage latch circuits 160-0, 160-4, 160-8, and 160-12, respectively.

When all the 16 data Din0 to Din15 are fetched, a load signal Load is activated. Consequently, the input data fetched by the latch circuits 160-0 to 160-15 are simultaneously supplied to the mini arrays 100 to 103 via the latch circuits 170-0 to 170-15. The mini arrays 100 to 103 simultaneously write the 16 data Din0 to Din15. In other words, the serial-parallel conversion circuit 140 executes a serial-parallel conversion of 16:1. Therefore, the data Din0 to Din15 can be input at a speed 16 times faster than the operation speed of the internal buses 150-0 to 150-15. Accordingly, when the operation speed of the internal buses 150-0 to 150-15 is 200 MHz, data can be input at the operation speed of 3.2 GHz (=200 MHz×16).

Figure 4:
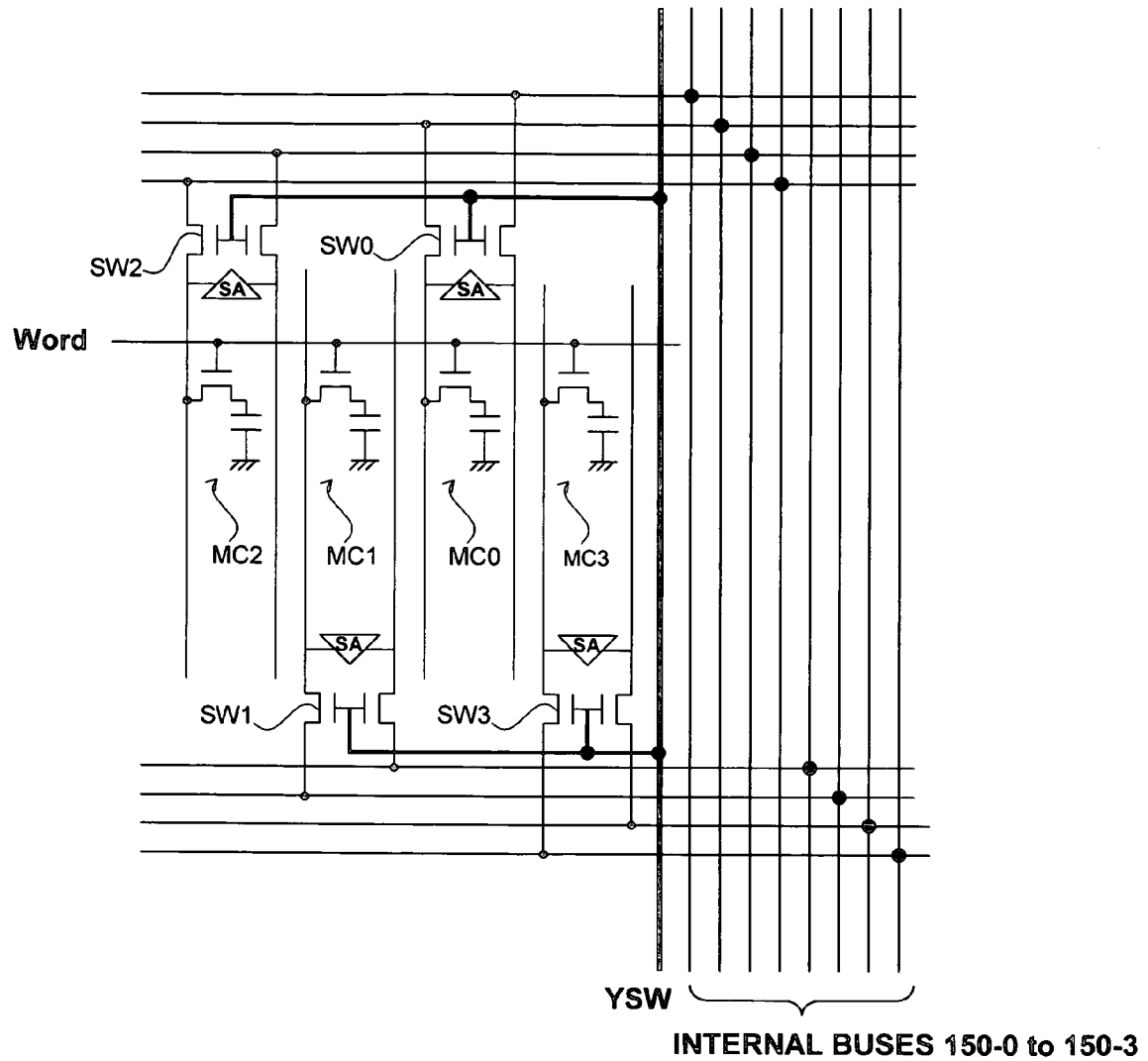
FIG. 4 is a partial circuit diagram showing a relationship between the four internal buses corresponding to the group of the mini array and memory cells.

FIG. 4 is a partial circuit diagram showing a relationship between the four internal buses 150-0 to 150-3 corresponding to the group of the mini array 100 and memory cells.

As shown in FIG. 4, the four (four pairs) internal buses 150-0 to 150-3 are connected to four memory cells MC0 to MC3, respectively via four Y switches SW0 to SW3 that turns on when a predetermined column selection signal YSW is activated. Just one word line is activated in each mini array. The four Y switches SW0 to SW3 are controlled based on the same column selection signal YSW, as described above. Therefore, combinations of the four memory cells MC0 to MC3 that are selected simultaneously are fixed.

Because of the layout of the circuits, usually the four memory cells MC0 to MC3 that are selected simultaneously are physically adjacent memory cells. Therefore, when the data writing is executed, Din12, Din8, Din4, and Din0 are written into the adjacent memory cells MC0 to MC3, respectively.

In testing the semiconductor memory device, the data Din0 to Din15 can be optional logical values. In this case, as explained above, when the semiconductor memory device inputs and outputs data at 3.2 GHz, optional logical values cannot be given to the data Din0 to Din15 without using a tester that can input and output data at 3.2 GHz. However, in the semiconductor memory device according to this embodiment, among the data Din0 to Din15 that are continuously input synchronously with the internal clock ICLK, continuous four data are assigned to mutually different mini arrays based on the functions of the serial-parallel conversion circuits 140 to 143. Therefore, data that are written into the same mini array are supplied at every other four data without exception.

Consequently, even when the switch cycle of input data is decreased to four times, individual data that are written into the same mini array can be optional values. In other words, by alternately supplying test data having different logical values at each half cycle of the external clock, individual data that are written into the same mini array can be optional values.

Figure 5:
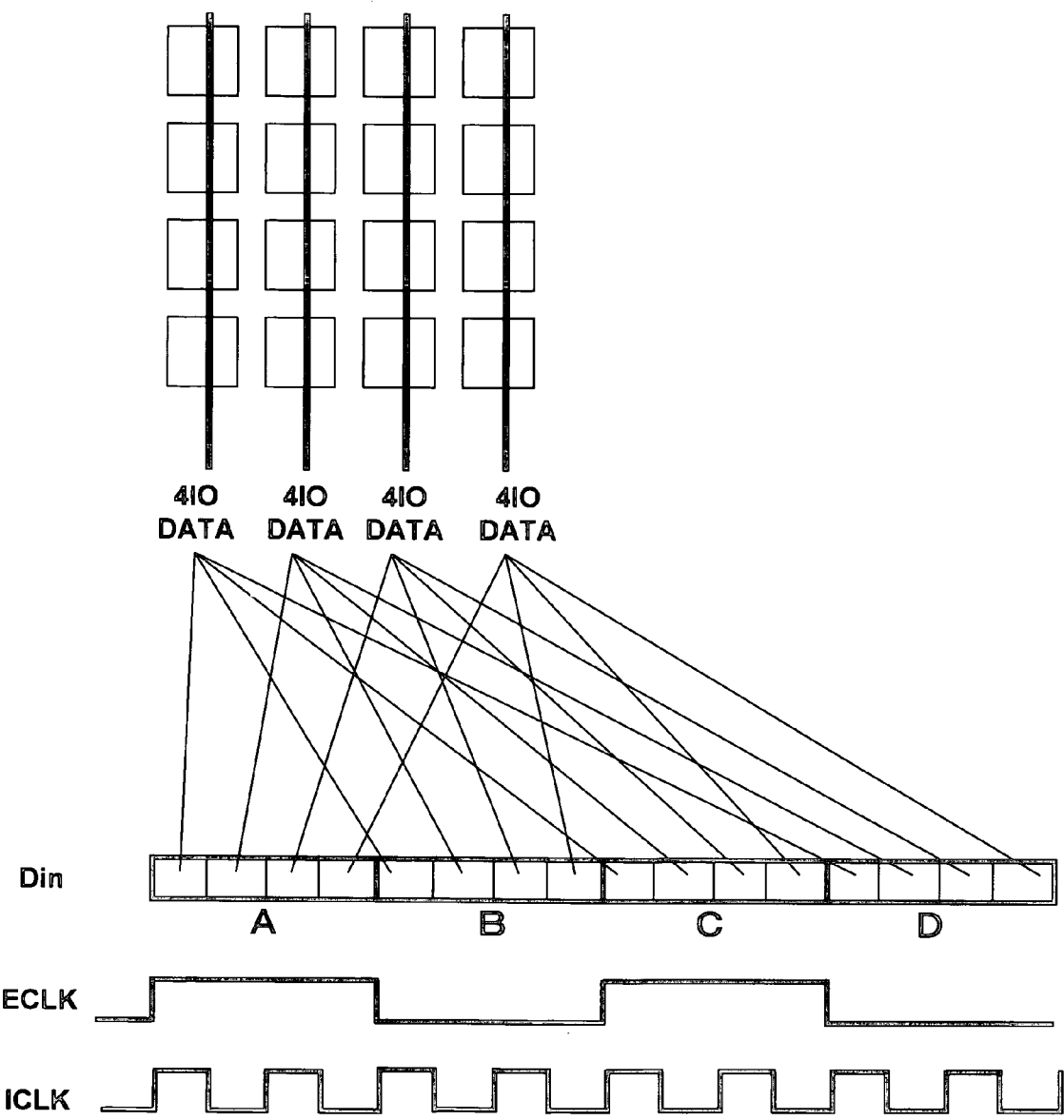
FIG. 5 is a schematic diagram for explaining one example of the testing method according to a preferred embodiment of the present invention.

FIG. 5 is a schematic diagram for explaining the above, and shows a state that test data of logical values are alternately supplied at each half cycle of an external clock ECLK.

Specifically, data during a period corresponding to the input data Din0 to Din3 (a period when the external clock ECLK is at a high level) is fixed to A. Similarly, data during a period corresponding to the input data Din4 to Din7 (a period when the external clock ECLK is at a low level) is fixed to B. Data during a period corresponding to the input data Din8 to Din11 (a period when the external clock ECLK is at a high level) is fixed to C. Data during a period corresponding to the input data Din12 to Din15 (a period when the external clock ECLK is at a low level) is fixed to D.

Based on this input cycle, the data A, B, C, and D (for example, a logical value "0101") are supplied to the four internal buses that are connected to the mini arrays. Consequently, even when the switch cycle of input data is decreased to four times, optional values can be written into the individual memory cells included in the same mini array. This means that the operation test can be executed correctly using a tester that has a data transfer rate of only a quarter of that of the semiconductor memory device. Therefore, when the semiconductor memory device has a data transfer rate 3.2 GHz, a tester having a data transfer capacity of only 800 MHz (=3.2 GHz/4) can carry out the operation test.

Figure 6:
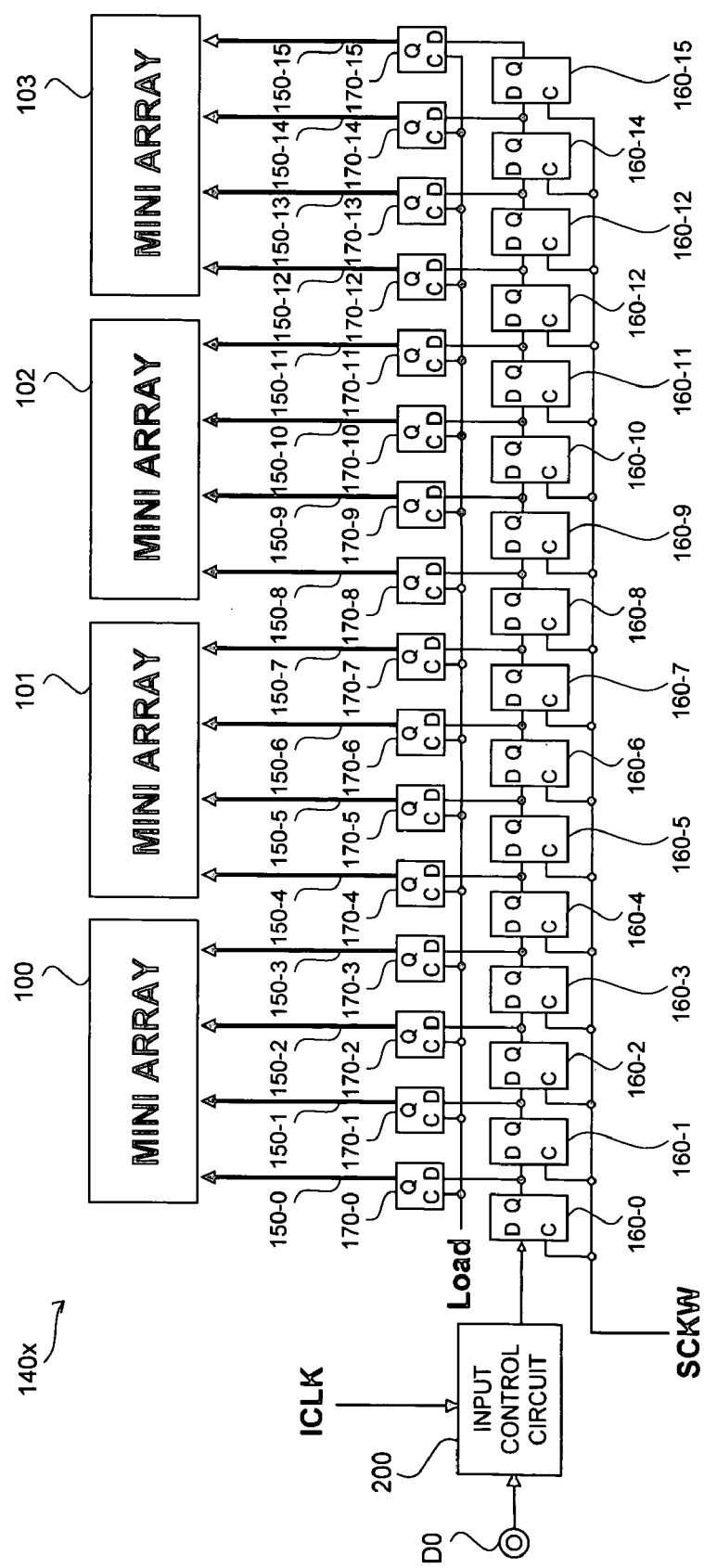
FIG. 6 is a circuit diagram showing elements relevant to the data writing, in a conventional serial-parallel conversion circuit.

FIG. 6 is a circuit diagram showing elements relevant to the data writing, in a conventional serial-parallel conversion circuit 140x different from the circuit according to this embodiment.

As shown in FIG. 6, the conventional serial-parallel conversion circuit 140x has a circuit similar to the serial-parallel conversion circuit 140 used in this embodiment. This serial-parallel conversion circuit 140x is different from the serial-parallel conversion circuit 140 in that, in the serial-parallel conversion circuit 140x, the latch circuits 160-0 to 160-15 are all connected subordinately, thereby forming a 16-stage shift register with the latch circuits 160-0 to 160-15.

Figure 7:
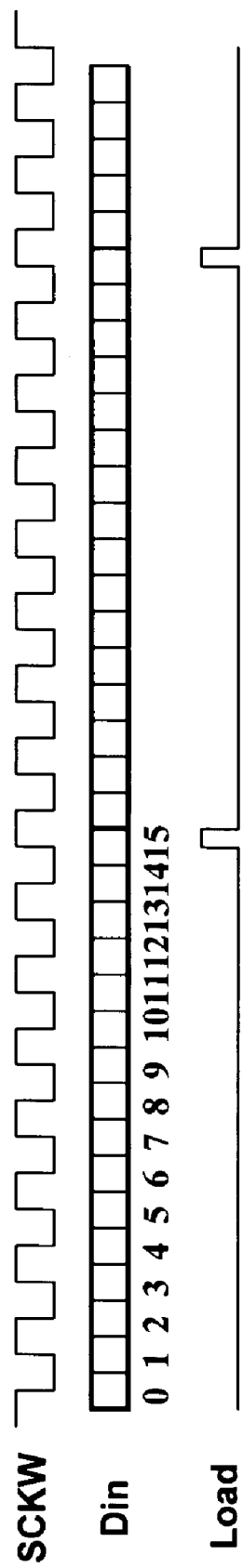
FIG. 7 is a timing diagram for explaining the operation of the circuits shown in FIG. 6.

According to this configuration, as shown in FIG. 7, the continuously supplied input data Din0 to Din15 sequentially shift within the shift register constituted by the latch circuits 160-0 to 160-15 interlocked with a single shift clock SCKW. When the 16 data Din0 to Din15 are fetched, these data are simultaneously supplied to the mini arrays 100 to 103 based on a load signal Load. In this case, a serial-parallel conversion of 16:1 is carried out. Among the 16 data Din0 to Din15, the data Din0 to Din3 are written into the group of the mini array 103. Similarly, Din4 to Din7 are written into the group of the mini array 102. Din8 to Din11 are written into the group of the mini array 101, and Din12 to Din15 are written into the group of the mini array 100.

Therefore, in testing the semiconductor memory device, when the continuous data Din0 to Din15 are not desired logical values, individual data written into the same mini array cannot be optional data. In other words, when a tester does not have a data transfer rate same as that of the semiconductor memory device, the tester cannot execute the test correctly. This is the most important characteristic different from that of the semiconductor memory device according to this embodiment.

Figure 8:
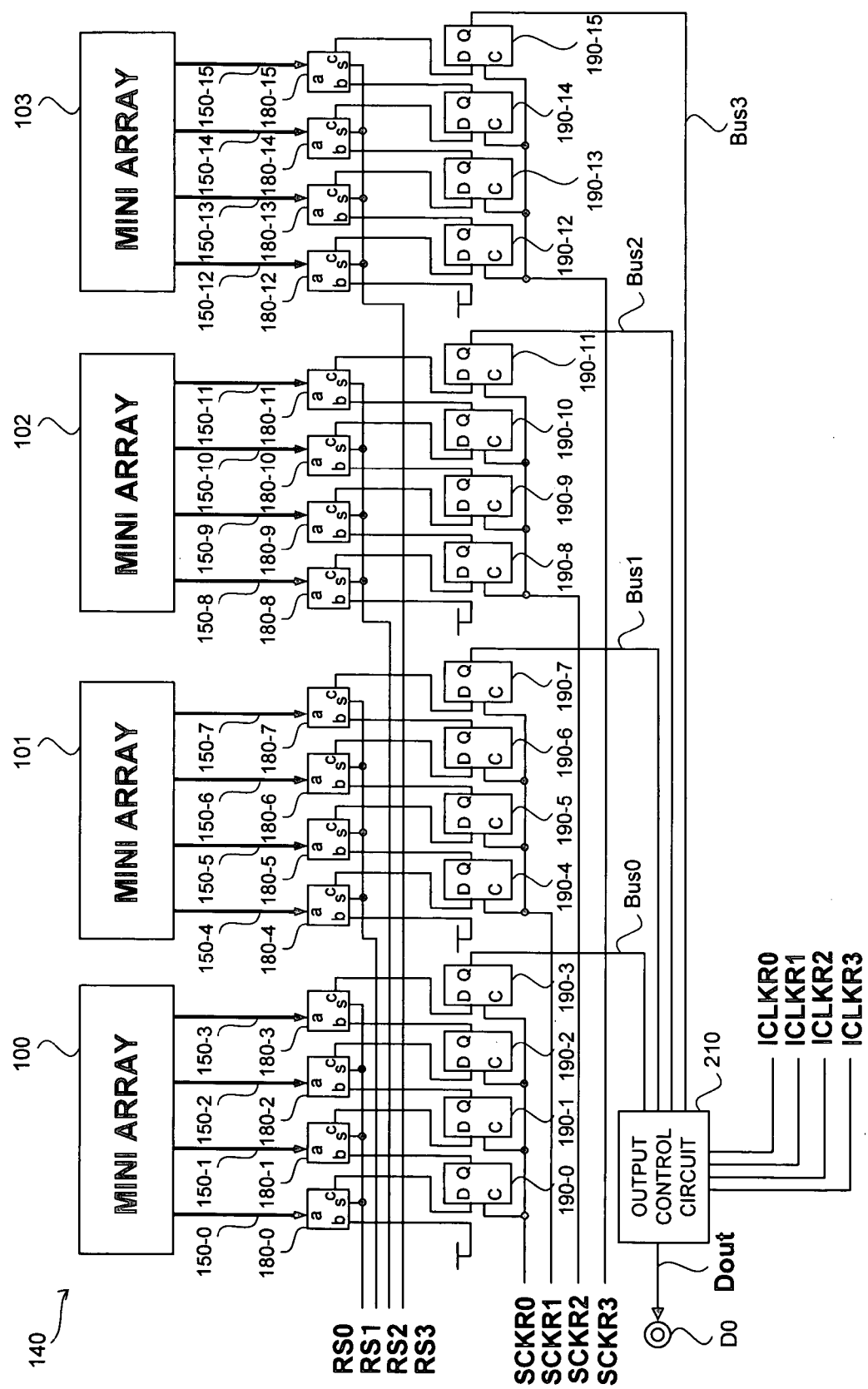
FIG. 8 is a circuit diagram showing elements relevant to the data reading, in the serial-parallel conversion circuit shown in FIG. 1.

FIG. 8 is a circuit diagram showing elements relevant to the data reading, in the serial-parallel conversion circuit 140.

As shown in FIG. 8, the serial-parallel conversion circuit 140 includes selector circuits 180-0 to 180-15 and latch circuits 190-0 to 190-15 corresponding to the 16 internal buses 150-0 to 150-15, separately from the latch circuits (160, 170) concerning data writing.

Each of the 16 selector circuits 180-0 to 180-15 has a first input node a and a second input node b. The selector circuits 180-0 to 180-15 are divided into four groups corresponding to the groups of the mini arrays 100 to 103. In other words, the selector circuits 180-0 to 180-15 are divided into a group of the selector circuits 180-0 to 180-3, a group of the selector circuits 180-4 to 180-7, a group of the selector circuits 180-8 to 180-11, and a group of the selector circuits 180-12 to 180-15. Selection signals RS0 to RS3 are supplied in common to select nodes s of selector circuits that constitute each group, respectively. Based on the selection signals RS0 to RS3, one of a signal supplied to the first input node a and a signal supplied to the second input node b is output from an output node c.

The output node c is connected to an input node D of corresponding one of the latch circuits 190-0 to 190-15. On the other hand, the first input node a is connected to a corresponding one of the internal buses 150-0 to 150-15, and the second input node b is connected to an output node Q of a pre-stage latch circuit of a corresponding one of the latch circuits 190-0 to 190-15.

The 16 latch circuits 190-0 to 190-15 are divided into four groups corresponding to the mini arrays 100 to 103. In other words the latch circuits 190-0 to 190-15 are divided into a group of the latch circuits 190-0 to 190-3, a group of the latch circuits 190-4 to 190-7, a group of the latch circuits 190-8 to 190-11, and a group of the latch circuits 190-12 to 190-15. Shift clocks SCK0 to SCK3 are supplied in common to clock nodes C of latch circuits that constitute each group, respectively. Latch circuits that constitute each group are subordinately connected via selector circuits. In other words, the output node Q of a pre-stage latch circuit is connected to the input node D of a post-stage latch circuit via a selector circuit.

With this arrangement, when the selection signals RS0 to RS3 select the second input node b, latch circuits that constitute each group form what is called a shift register. The last end of the shift registers, that is, the output node Q of the latch circuits 190-3, 190-7, 190-11, and 190-15, respectively are connected to the output control circuit 210 via the internal buses Bus0 to Bus3. The latch circuits 190-0 to 190-15 fetch data supplied to the input node D and output the data to the output node Q, when levels of the shift clocks SCKR0 to SCKR3 that are supplied to the clock ends change, that is, when the level changes from a high level to a low level or from a low level to a high level.

Four timing signals ICLKR0, ICLKR1, ICLKR2, and ICLKR3 are supplied to the output control circuit 210. The output control circuit 210 sequentially outputs read data that are supplied via the internal buses Bus0 to Bus3, to the data input and output pin D0 in synchronism with these timing signals.

Figure 9:
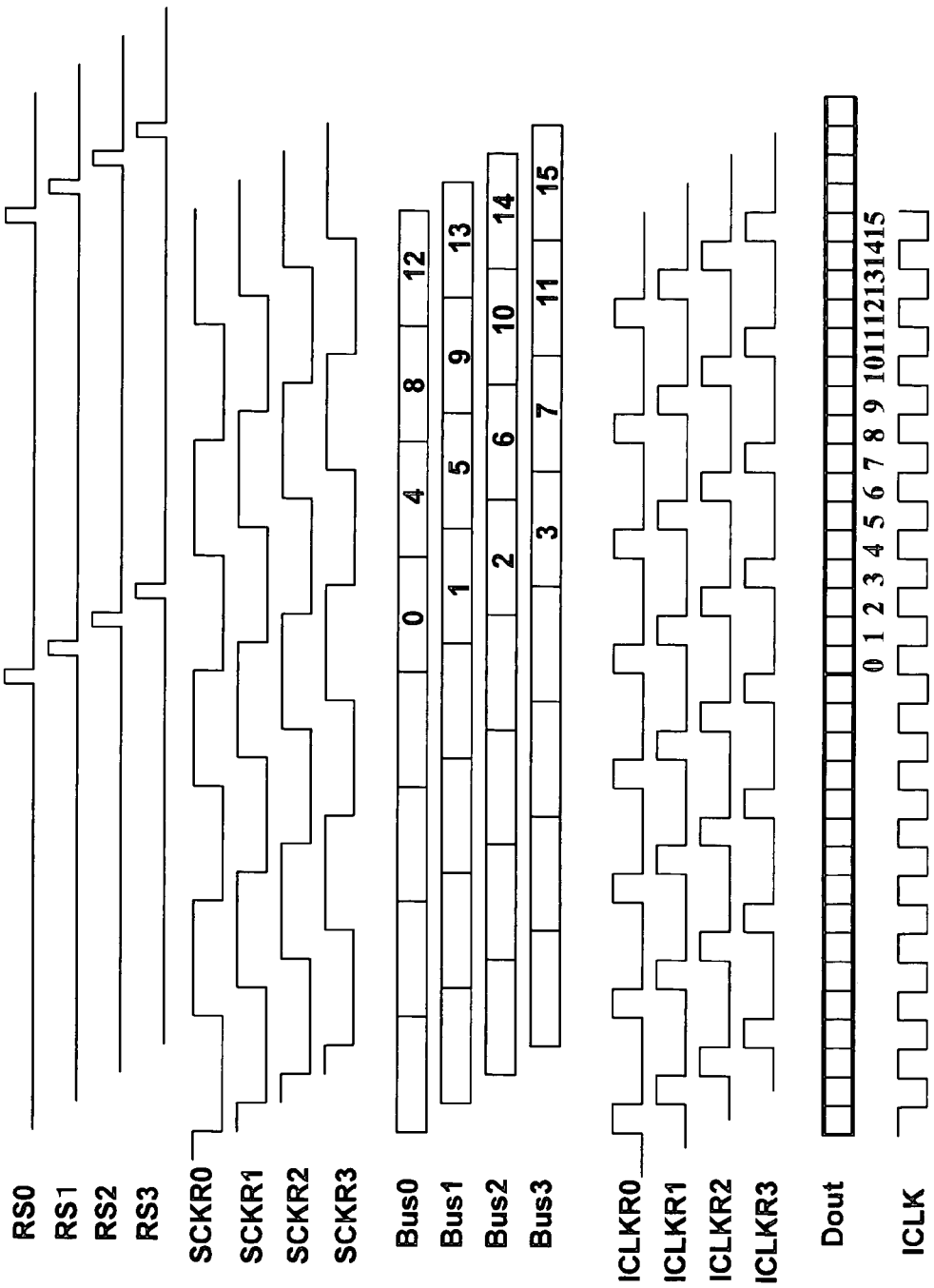
FIG. 9 is a timing diagram for explaining the operation of the circuits shown in FIG. 8.

FIG. 9 is a timing diagram for explaining the operation of the circuits shown in FIG. 8.

As shown in FIG. 9, the shift clocks SCKR0 to SCKR3 of which phases are mutually different by 45 degrees are supplied to four reading shift registers. The selection signals RS0 to RS3 are continuously activated, by shifting a half cycle of the internal clock ICLK once per eight cycles of the internal clock ICLK. Therefore, when the selection signals RS0 to RS3 are activated continuously, the first input ends a of the selector circuits 180-0 to 180-15 are selected, and read data on the 16 internal buses 150-0 to 150-15 are fetched sequentially into the corresponding latch circuits 190-0 to 190-15 via the selector circuits 180-0 to 180-15.

Thereafter, the selection signals RS0 to RS3 are sequentially inactivated, and the second input nodes b of the selector circuits 180-0 to 180-15 are selected. These four shift registers carry out a shift operation in synchronism with the shift clocks SCKR0 to SCKR3. Accordingly, the read data are sequentially output to the output control circuit 210 via the internal buses Bus0 to Bus3.

As shown in FIG. 9, the four timing signals ICLKR0, ICLKR1, ICLKR2, and ICLKR3 that are supplied to the output control circuit 210 are synchronous with the internal clock ICLK, and have waveforms that are activated synchronously with the rising edge and the falling edge of the shift clocks SCKR0 to SCKR3. Therefore, output data Dout0 to Dout15 on the internal buses BUS0 to BUS3 are sequentially selected each time when the timing signals ICLKR0, ICLKR1, ICLKR2, and ICLKR3 are activated. Accordingly, the output data Dout0 to Dout15 are continuously output from the data input and output pin D0 synchronously with the internal clock ICLK. Therefore, at the data reading data, four data that are simultaneously read from different mini arrays are output continuously, in reverse way at the data writing time.

Because the parallel-serial conversion of 1:16 is carried out in the data reading, the data Dout0 to Dout15 can be read out at a 16-time faster speed than the operation speed of the internal buses 150-0 to 150-15.

Figure 11:
FIG. 11 is a timing diagram for explaining the testing method for testing an edge of an internal clock.

At the test time, it is checked, by using a window strobe function, whether the logical level of the output data Dout is not changed during a period when the external clock ECLK is fixed to a high level or a low level. Based on this, the occurrence of an error can be detected without checking logical values of individual data. As explained above, when a low-speed tester is used and when four continuous data are the same logical values, pattern sensitivity of memory cells can be checked. As shown in FIG. 11, when the same four continuous data are tested at four divided times by shifting the data by one cycle, the edges E1, E2, E3, and E4 of the internal clock ICLK can be also tested.

As explained above, the semiconductor memory device according to this embodiment assigns continuous four data to mutually different mini arrays during the write operation, and continuously outputs the four data that are simultaneously read from different mini arrays during the read operation. Therefore, a lower-speed tester can carry out the operation test. Consequently, it is not necessary to develop a high-speed tester by matching the operation speed of the semiconductor memory device. Accordingly, the manufacturing cost of the semiconductor memory device can be reduced.

The present invention is in no way limited to the aforementioned embodiments, but rather various modifications are possible within the scope of the invention as recited in the claims, and naturally these modifications are included within the scope of the invention.

Figure 10:
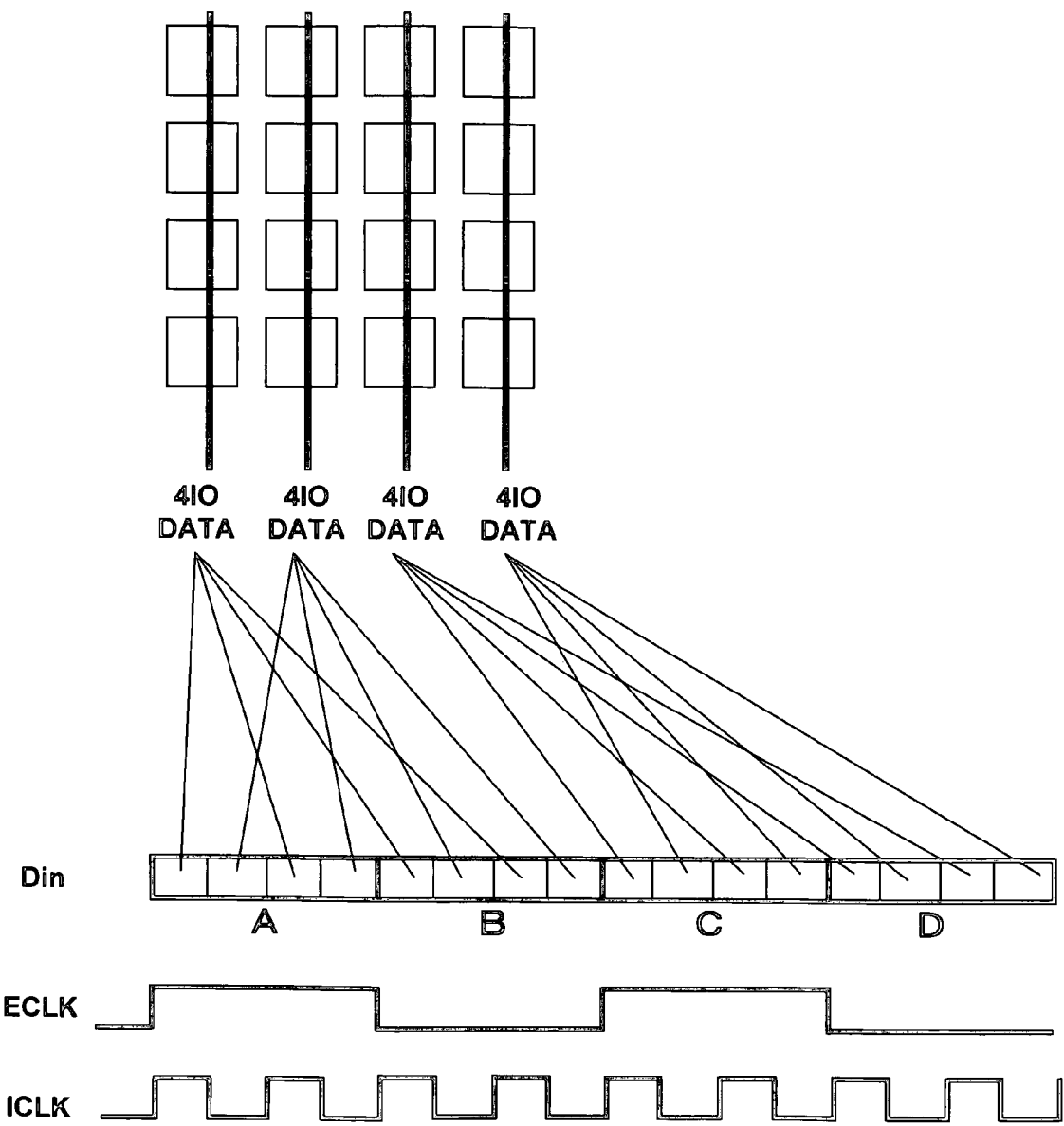
FIG. 10 is a schematic diagram for explaining another example of the testing method according to a preferred embodiment of the present invention.

For example, while continuous four data are assigned to mutually different mini arrays in this embodiment, it is sufficient to assign at least two continuous data to mutually different mini arrays in this invention. Therefore, even when the frequency of the internal clock ICLK is four times the frequency of the external clock ECLK like in the embodiment described above, data input during a half cycle period of the external clock ECLK can be alternately assigned to a mini array 100 (or 102) and a mini array 101 (or 103) as shown in FIG. 10.

In the above embodiment, it is explained that four data are input and output during a period when the external clock ECLK holds a high level or a low level. Alternatively, two data can be input and output during a period when the external clock ECLK holds a high level or a low level. In this case, the two data can be assigned to different mini arrays.

Alternatively, eight data can be input and output during a period when the external clock ECLK holds a high level or a low level. In this case, the eight data can be assigned to mutually different mini arrays. Alternatively, continuous four data can be assigned to mutually different mini arrays, thereby assigning each two data to different four mini arrays, or alternately assigning the data to different two mini arrays.

As explained above, according to the present invention, a low-speed tester can be used to correctly test the operation of a semiconductor memory device that inputs and outputs data synchronously with a high-speed clock. Therefore, it is not necessary to develop a high-speed tester to match the operation speed of a semiconductor memory device. Consequently, the manufacturing cost of a semiconductor memory device can be reduced.

What is claimed is:

1. A semiconductor memory device, comprising:
a plurality of mini arrays; and
a serial-parallel conversion circuit that supplies write data to the plurality of mini arrays and outputs read data supplied from the mini arrays,
wherein said serial-parallel conversion circuit simultaneously supplies at least two continuous write data to different mini arrays that are continuously supplied from an outside synchronously with an internal clock, and continuously outputs at least two read data simultaneously supplied from different mini arrays, synchronously with the internal clock,
said internal clock has a frequency that is N (even number) times frequency of an external clock, and
M (even number: M≧N) data that are continuously input and output synchronously with the internal clock are assigned to different mini arrays, during a period when the external clock is fixed to a high level or a low level.

2. The semiconductor memory device as claimed in claim 1, wherein said internal clock has a frequency that is two times the frequency of the external clock, and two data that are continuously input and output synchronously with the internal clock are assigned to different mini arrays, during a period when the external clock is fixed to a high level or a low level.

3. The semiconductor memory device as claimed in claim 1, wherein said internal clock has a frequency that is four times the frequency of the external clock, and four data that are continuously input and output synchronously with the internal clock are assigned to different mini arrays, during a period when the external clock is fixed to a high level or a low level.

4. The semiconductor memory device as claimed in claim 1, wherein said internal clock has a frequency that is four times the frequency of the external clock, and four data that are continuously input and output synchronously with the internal clock are alternately assigned to two different mini arrays, during a period when the external clock is fixed to a high level or a low level.

5. The semiconductor memory device as claimed in claim 1, wherein said internal clock has a frequency that is eight times the frequency of the external clock, and eight data that are continuously input and output synchronously with the internal clock are assigned to different mini arrays, during a period when the external clock is fixed to a high level or a low level.

6. The semiconductor memory device as claimed in claim 1, wherein said internal clock has a frequency that is eight times the frequency of the external clock, and out of eight data that are continuously input and output synchronously with the internal clock, four continuous data are assigned to different mini arrays, thereby assigning two data to different four mini arrays.

7. The semiconductor memory device as claimed in claim 1, wherein said internal clock has a frequency that is four times the frequency of the external clock, and eight data that are continuously input and output synchronously with the internal clock are alternately assigned to two different mini arrays, during a period when the external clock is fixed to a high level or a low level.

8. A testing method of a semiconductor memory device having a plurality of mini arrays and serial-parallel conversion circuits provided to the respective mini arrays, each serial-parallel conversion circuit supplying write data in parallel to a corresponding mini array, and outputting read data in series which are supplied in parallel from the corresponding mini array, the testing method comprising:
a first step for supplying a plurality of write data to the respective serial-parallel conversion circuits synchronously with an internal clock in the order of receiving the write data in series so that each serial-parallel conversion circuit receives at least two write data in series;
a second step for simultaneously supplying the at least two write data in parallel from each serial-parallel conversion circuit to a corresponding mini array; and
a third step for supplying at least two read data in parallel to each serial-parallel conversion circuit from the corresponding mini array, and outputting the read data from the serial-parallel conversion circuits synchronously with the internal clock, wherein
said internal clock has a frequency that is N (even number) times frequency of an external clock, and
M (even number: M≧N) data that are continuously input and output synchronously with the internal clock are assigned to different mini arrays, during a period when the external clock is fixed to a high level or a low level.

9. A semiconductor memory device, comprising:
at least first and second mini arrays each receiving and outputting data in parallel;
a first serial-parallel conversion circuit provided to the first mini array, the first serial-parallel conversion circuit receiving first data each supplied in series every two or more cycles of an internal clock so as to supply the received first data in parallel to the first mini array, and receiving the first data from the first mini array in parallel and outputting the first data every two or more cycles of the internal clock in series; and
a second serial-parallel conversion circuit provided to the second mini array, the second serial-parallel conversion circuit receiving second data each supplied in series every two or more cycles of the internal clock alternately with those supplied to the first serial-parallel conversion circuit, so as to supply the received second data in parallel to the second mini array, and receiving second data in parallel from the second mini array and outputting the second data in series every two or more cycles of the internal clock alternately with those supplied to the first serial-parallel conversion circuit, wherein
said internal clock has a frequency that is N (even number) times frequency of an external clock, and
M (even number: M≧N) data that are continuously input and output synchronously with the internal clock are assigned to different mini arrays, during a period when the external clock is fixed to a high level or a low level.

* * * * *